United States Patent [19]
Asai et al.

[11] Patent Number: 5,589,250
[45] Date of Patent: Dec. 31, 1996

[54] RESIN COMPOSITIONS AND PRINTED CIRCUIT BOARDS USING THE SAME

[75] Inventors: Motoo Asai; Ritsuko Kato, both of Gifu, Japan

[73] Assignee: Ibiden Co., Ltd., Gifu, Japan

[21] Appl. No.: 518,358

[22] Filed: Aug. 23, 1995

Related U.S. Application Data

[63] Continuation of Ser. No. 225,331, Apr. 8, 1994, abandoned.

[30] Foreign Application Priority Data

Apr. 12, 1993 [JP] Japan ..................... 5-109961

[51] Int. Cl.⁶ .......................................... B32B 9/00
[52] U.S. Cl. .............................. 428/209; 361/748
[58] Field of Search ....................... 361/748, 749; 428/209, 210, 901

[56] References Cited

U.S. PATENT DOCUMENTS

| | | | |
|---|---|---|---|
| 3,873,309 | 3/1975 | Goffe | 428/209 |
| 3,962,520 | 6/1976 | Watanabe | 525/532 |
| 4,752,499 | 6/1988 | Enomoto | 427/98 |
| 5,021,472 | 6/1991 | Enomoto | 523/427 |
| 5,055,321 | 10/1991 | Enomoto | 427/98 |
| 5,135,717 | 8/1992 | Renzoni et al. | 536/18.7 |
| 5,344,893 | 9/1994 | Asai | 428/209 |

FOREIGN PATENT DOCUMENTS

| | | |
|---|---|---|
| 3913966 | 11/1989 | Germany. |
| 4-55555 | 9/1992 | Japan. |
| 5-18476 | 3/1993 | Japan. |

OTHER PUBLICATIONS

Benson et al., "Absorption of Fluorescence Properties of Cyanine Dyes", Journal of Chemical and Engineering Data, vol. 22, No. 4, 1977, pp. 379–383.

Patent Abstracts of Japan, vol. 16, No. 465 (E–1270), Sep. 28, 1992.

DATABASE WPI, Week 7916, Derwent Publications Ltd.., London GB; AN 79-30724B.

European Search Report and Annex.

*Primary Examiner*—Patrick Ryan
*Assistant Examiner*—Patrick Jewik
*Attorney, Agent, or Firm*—Greenblum & Bernstein P.L.C.

[57] ABSTRACT

A resin composition as well as a printed circuit board using the same are disclosed. The resin composition is formed by dispersing powder of a cured heat-resistant resin powder soluble in acid or oxidizing agent into a matrix of an uncured photosensitive resin hardly soluble in acid or oxidizing agent, in which a coloring matter is added to the resin matrix and/or the heat-resistant resin powder.

9 Claims, 2 Drawing Sheets

FIG_2a   FIG_2b   FIG_2c   FIG_2d

1

RESIN COMPOSITIONS AND PRINTED CIRCUIT BOARDS USING THE SAME

This application is a continuation of application Ser. No. 08/225,331, filed Apr. 8, 1994, now abandoned.

BACKGROUND OF THE INVENTION

1. Field of the Invention

This invention relates to a resin composition and a printed circuit board using the same, and more particularly to a resin composition capable of providing a printed circuit board having improved appearance and color tone.

2. Disclosure of Related Art

As a method of producing a printed circuit board, there is an additive method. This additive method is a method wherein an adhesive for electroless plating is applied onto an insulating substrate of glass-epoxy resin or the like to form an adhesive layer, and the surface of the adhesive layer is roughened, and a plated resist is formed on the roughened surface, and then a metal for a conductor circuit is adhered thereto through electroless plating.

According to this method, the conductor circuit is adhered to the toughened adhesive layer through plating or the like, so that an excellent joining property can be ensured therebetween to prepare a printed circuit board having an excellent reliability.

Therefore, the adhesive for electroless plating used in the above method is necessary to have a function that the surface after the curing can be roughened. For this purpose, there is adopted an adhesive formed by adding a soluble filler to an epoxy resin as a resin matrix (see JP-A-5-18476). Such an adhesive made from the epoxy resin is excellent in the heat resistance as compared with an adhesive made from rubber or the like and can improve the heat resistance of a printed circuit board.

Furthermore, there is proposed a photosensitive resin composition formed by giving a photosensitive group to the epoxy resin as-the resin matrix (see JP-A-4-55555). When using such a composition, the occurrence of strain cracking produced in the heat-curing of the adhesive is effectively prevented by the curing through light exposure, or the formation of via-hole on an interlaminar insulating layer in a so-called built-up multi-layer printed circuit board suitable for high densification can easily be made by light exposure and development.

However, the aforementioned epoxy resin or photosensitive resin composition has a light permeability, so that when it is used as a resin matrix of an adhesive for electroless plating, an internal circuit can be seen from the exterior and hence an appearance and a color tone of the printed circuit board are undesirably degraded.

For this end, the adjustment of color tone in the printed circuit board has hitherto been carried out by a so-called solder resist process in which a colored solder resist is printed on the printed wiring substrate. In the solder resist process, however, the resin material constituting the printed wiring substrate is discolored through oxidation by a heating treatment applied in the part mounting or the like. Such a discoloration is usually dark brown and forms a stripe pattern without showing constant coloration, so that the appearance of the printed circuit board is not yet improved even if the solder resist is printed. Particularly, since the resin layers are successively piled one upon the other and cured in the multi-layer printed circuit board of built-up structure, the degree of discoloration is remarkable and even when the colored solder resist is formed as the outermost layer, the discolored portion of the under layer is not sufficiently covered with the presence of the outermost layer, and hence the non-uniform discoloration of the underground layer is undesirably permeated.

In order to cover such a discoloration, there are a means for increasing an amount of a coloring agent to make a deeper color, a means for increasing a thickness of a colored solder resist layer and the like. However, the addition of a great amount of the coloring agent generally brings about the degradation of the insulating property, while the thickening of the resist layer brings about the increase of material cost. In case of using the photosensitive resin, the resolution of the resin undesirably lowers.

SUMMARY OF THE INVENTION

It is, therefore, an object of the invention to solve the above problems of the conventional techniques and to provide a resin composition capable of advantageously providing a printed circuit board having excellent appearance and color tone without damaging the reliability.

The inventors have made various studies in order to realize the above object and found that the object can be realized by using a resin composition containing a coloring matter as an adhesive layer and also the deterioration of the adhesive layer through ultraviolet ray can be suppressed, and as a result the invention has been accomplished.

According to a first aspect of the invention, there is the provision of a resin composition formed by dispersing powder of a cured heat-resistant resin powder soluble in acid or oxidizing agent into a matrix of an uncured photosensitive resin hardly soluble in acid or oxidizing agent, in which a coloring matter is added to the resin matrix and/or the heat-resistant resin powder.

In preferred embodiments of the invention, the coloring matter is selected from phthalocyanine and derivatives thereof and cyanine color, and the amount of the coloring matter is 0.10–1.50% by weight based on total weight of solid content in the resin composition.

According to a second aspect of the invention, there is the provision of a printed circuit board comprising a substrate, an adhesive layer formed on the substrate by dispersing powder of a cured heat-resistant resin powder soluble in acid or oxidizing agent into a matrix of an uncured photosensitive resin hardly soluble in acid or oxidizing agent, and a conductor circuit formed on the adhesive layer, in which a coloring matter is added to the resin matrix and/or the heat-resistant resin powder.

According to a third aspect of the invention, there is the provision of a printed circuit board comprising a substrate, a conductor circuit formed on the substrate, an adhesive layer formed as an interlaminar insulation layer on the conductor circuit by dispersing powder of a cured heat-resistant resin powder soluble in acid or oxidizing agent into a matrix of an uncured photosensitive resin hardly soluble in acid or oxidizing agent, and another conductor circuit formed on the adhesive layer, in which a coloring matter is added to the resin matrix and/or the heat-resistant resin powder.

BRIEF DESCRIPTION OF THE DRAWINGS

The invention will be described with reference to the accompanying drawings, wherein.

DESCRIPTION OF THE PREFERRED EMBODIMENTS

The resin composition according to the invention lies in a resin composition formed by dispersing powder of a cured heat-resistant resin powder soluble in acid or oxidizing agent into a matrix of an uncured photosensitive resin hardly soluble in acid or oxidizing agent, characterized in that a coloring matter is added to the resin matrix and/or the heat-resistant resin powder. When this composition is used as an adhesive layer for the printed circuit board, the interlaminary insulation layer is colored to provide a printed circuit board having excellent color tone and appearance. In the multi-layer printed circuit board, all of the insulation layers can be particularly colored to decrease the content of the coloring matter per unit volume of the adhesive layer and hence the board having an excellent color tone can be provided without standing out the discoloration through the oxidation.

As a result, there can be solved problems that the insulation is lowered by adding a great amount of a coloring agent in the covering for resin discoloration through the solder resist process, and the degradation of resolution and the rise of the cost are brought about by the thickening the thickness of the resist layer.

Furthermore, the conventional resin composition for use in the printed circuit board is deteriorated through ultra-violet ray or the like. This theory is based on the fact that the resin chain is cut by the ultra-violet ray or the like to produce radicals and the radicals react with oxygen or the like to form peroxy radicals, which react with other resin chain or water to newly cut the resin chain. On the contrary, the resin composition according to the invention contains the phthalocyanine or its derivative, or cyanine color as a coloring matter, so that the deterioration of the cured resin (i.e. adhesive layer) in air can be controlled by the presence of the coloring matter.

Because, phthalocyanine or its derivative represented by the following general formula (I), or cyanine color represented by the following general formula (II) or (III) has a conjugated unsaturated bond, which reacts with an active radical in the resin to stabilize the radical, so that, while note being found by theory, such a radical can control the reaction with resin, oxygen, water and the like to control the deterioration of the cured resin (adhesive layer).

Formula (I)

(wherein M is an ion of a metal selected from sodium, potassium, copper, iron, cobalt, nickel and the like, and X is a hydrogen atom, a halogen atom selected from chlorine, bromine, fluorine and iodine or an alkyl group)

Formula (II)

(wherein Y and Y' are O, S, Se, —NH or —CH=CH—, R and R' are an alkyl group such as methyl group, ethyl group, propyl group or the like, or a carboxyalkyl group such as carboxyethyl group or the like, X is a halogen atom and n is 0–3)

Formula (III)

(wherein X is S or $C(CH_3)_2$, R is a halogen atom, an alkyl group or a hydrogen atom, n is 0–5, m is 0–4 and k is 0–6)

Moreover, when the photosensitive resin is used in the resin composition, the photocuring of the resin is a radical polymerization reaction and is suppressed by the presence of the coloring matter, so that it tends to somewhat lower the photosensitivity of the resin, which can be improved by optimizing exposure amount, time and the like.

Thus, it is considered that anyone of phthalocyanine and its derivative and cyanine color can control the deterioration of the cured resin (adhesive layer) in air without largely changing the photocuring step.

According to the invention, the coloring matter included in the resin composition is desirable to be phthalocyanine and its derivative or cyanine color. Because, such a coloring matter can control the deterioration of the cured resin in the aforementioned resin composition and is stable against light without decomposition even upon exposure to organic solvent or strong acid, so that it does not deteriorate the properties required in the printed circuit board. Particularly, phthalocyanine is good in chromophoric property at low concentrations in view of its structure, and is stable and does not largely deteriorate the insulating property.

As the phthalocyanine or its derivative of the formula (I), phthalocyanine blue in which the metal ion is copper and X is a hydrogen atom, or phthalocyanine green in which the metal ion is copper and X is a chlorine atom is favorable. As the cyanine color, NK 1160 made by Nippon Kanko Shikiso Laboratory and represented by the following formula (IV) in which Y' is S, R' is —$CH_2CH_2COOH$ and n is 2 in the formula (II), or NK 3682 made by Nippon Kanko Shikiso Laboratory and represented by the following formula (V) in which X is $C(CH_3)_2$, R is a hydrogen atom, n is 3, m is 2 and k is 4 in the formula (III) is favorable.

Formula (IV) (n = 2)

Formula (V)

According to the invention, the content of the coloring matter included in the resin composition is desirable to be 0.10–1.50% by weight per total weight of the solid content in the resin composition.

When the content of the coloring matter is less than 0.10% by weight, the inner layer of conductor circuit can not be covered and there is no effect of suppressing the deterioration of the resin, while when it exceeds 1.50% by weight, the electrical insulative property lowers due to the hygroscopicity inherent to the coloring matter (water is coordinated in the central metal ion in case of the complex).

Moreover, the coloring matter used in the invention is included in the resin matrix and/or the cured heat-resistant resin powder, but it is favorable to include the coloring matter in the resin matrix in view of the mixing easiness.

According to the invention, the heat-resistant resin powder used in the resin composition is desirable to be selected from the group consisting of (1) heat-resistant resin powder having an average particle size of not more than 10 μm, (2) aggregated particles having an average particle size of 2–10 μm formed from heat-resistant resin powder having an average particle size of not more than 2 μm, (3) a mixture of heat-resistant resin powder having an average particle size of 2–10 μm and heat-resistant resin powder having an average particle size of not more than 2 μm, and (4) false-particles formed by adhering at least one of heat-resistant resin powder having an average particle size of not more than 2 μm and inorganic powder having an average particle size of not more than 2 μm to surfaces of heat-resistant resin powder having an average particle size of 2–10 μm.

As to shape and depth of anchor formed by the adhesive layer, it is desirable that the surface roughness is within a range of 1–20 μm in accordance with the filler having different particle size. In this case, sufficient adhesion strength of conductor is obtained.

Since the shape of the anchor becomes complicated by the above method, when the resin composition according to the invention is applied to the printed circuit board, the adhesion strength (peel strength) between the plated film and the adhesive layer is improved.

The heat-resistant resin powder is constructed by the heat-resistant resin subjected to a curing treatment. Because, when using the uncured resin, if the resin composition is diluted with an organic solvent or the like, it is impossible to develop the performance (anchor performance) as the heat-resistant resin powder.

The heat-resistant resin constituting the heat-resistant resin powder is preferably selected from at least one of epoxy resin, polyester resin, bismaleimide-triazine resin and amine resin such as melamine or the like. Among the epoxy resins, an epoxy resin cured by an amine type curing agent, or an epoxy resin having a hydroxyether structure is favorable. The resin constituting such a heat-resistant resin powder is desirable to have a light transmission property because when the light transmissible filler is used in the photosensitive resin composition, light scattering can effectively be prevented in the curing by the exposure to light.

The heat-resistant resin powder can be obtained, for example, by pulverizing the heat-resistant resin after the thermosetting through jet mill, freeze-grinding machine or the like, by spray-drying the heat-resistant resin solution to directly form fine powder before the curing treatment, and the like.

As the curing method for the heat-resistant resin powder, there are heat-curing, curing with a catalyst and the like.

In the invention, the thus obtained heat-resistant resin powder is added to a heat-resistant resin solution constituting the resin matrix and uniformly dispersed thereinto. The amount of the heat-resistant resin powder added is preferably within a range of 5–350 parts by weight per 100 parts by weight of solid content in the resin matrix. Particularly, when it is within a range of 20–200 parts by weight, the high adhesion strength to electroless plated layer is obtained. When the amount is less than 5 parts by weight, the anchor density is too low, while when it exceeds 350 parts by weight, the resin layer is dissolved and the adhesion strength to the electroless plated layer can not be obtained. Moreover, the heat-resistant resin powder may contain alumina, beryllia, silicon nitride, silicon boride or the like.

As the heat-resistant resin solution, a heat-resistant resin not containing solvent can be used as it is. Particularly, when the heat-resistant resin is dissolved in a solvent to form the heat-resistant resin solution, the adjustment of viscosity is easy and the resin powder can uniformly be dispersed in the resin solution, so that the use of the resin solution is preferable. As the solvent dissolving the heat-resistant resin, use may be made of methyl ethyl ketone, methylcellosolve, ethylcellosolve, butylcellosolve, butylcellosolve acetate, butyl carbitol, butyl cellulose, tetraline, dimethylformamide, N-methyl pyrrolidone, dimethylsulfoxide and the like.

As the heat-resistant resin, it is preferable to use a light transmissible resin such as epoxy resin, epoxy-modified polyimide resin, polyimide resin, phenolic resin, a mixed resin of epoxy resin and polyether sulphone resin, acrylic resin, or the like. Particularly, the resin having a light transmission of not less than 10% as measured according to JIS-K-7105 is favorable. According to the invention, it is desirable to use a heat-resistant resin having a photosensitive group, e.g., a resin obtained by introducing an acryl group into the above resin. Because, when the photosensitive resin composition is applied to the printed circuit board, via-hole can easily be formed by light exposure and development and hence a so-called build-up multi-layer printed circuit board having a high integrated density can advantageously be manufactured.

In the resin composition according to the invention, a roughened surface can be formed on a cured product of the resin composition in accordance with the difference in solubility against acid or oxidizing agent between the heat-resistant resin powder and the resin matrix. Thus, when the resin composition according to the invention is applied to the printed circuit board, the excellent adhesion property to electroless plated layer can be ensured by the anchor effect of the above roughened surface.

Moreover, the resin composition according to the invention can be rendered into a film at a so-called B-stage (semi-curing) in which the resin composition is shaped to a film and dried. Furthermore, the resin composition can be used as a substrate for an adhesive by shaping into a form of a substrate.

The production of the printed circuit board using the resin composition according to the invention will be described in detail below.

(1) In the production of the printed circuit board, the resin composition according to the invention is first applied onto a substrate or the film-like resin composition is laminated on the substrate and then dried and cured to form an adhesive layer. The thickness of the adhesive layer obtained at this step is about 20–100 μm.

As a means for applying the resin composition, it is desirable to use roller coat, dip coat, spray coat, spinner coat, curtain coat, screen print or the like.

The curing of the resin composition is conducted by heating when the resin matrix is the thermosetting resin, or by light exposure when the resin matrix is the photosensitive resin. On the other hand, when the resin obtained by substituting a part of functional group (epoxy group or the like) in the thermosetting resin with a photosensitive group (acryl group) is used as a resin matrix, it is exposed to light, developed and cured by heating because the crosslinking density of the resin is enhanced to improve the resistance to chemicals, particularly resistance to chromic acid.

Moreover, when the photosensitive resin composition is cured by light exposure, a portion to be developed is covered with a printed mask and exposed to light and developed, whereby a portion of the adhesive layer covered with the mask is dissolved and removed out. By this development treatment, an opening portion for the via-hole can be formed.

In the development treatment, there may be used a so-called chlorine series solvent such as methylene chloride, 1,1,1-trichloroethane or the like; a so-called organic solvent such as alcohol, polyethylene glycol, benzene, toluene or the like; an alkali solvent such as sodium carbonate, sodium hydroxide or the like; an organic acid such as acetic acid or the like; and an inorganic acid such as sulfuric acid or the like. Among them, the use of the organic solvent, acid, alkali or a mixture thereof is desirable in view of the influence on environment such as ozone breakage or the like.

As the substrate used in the invention, mention may be made of plastic substrate, ceramic substrate metal substrate, film substrate and the like, a typical example of which includes glass-epoxy resin substrate, glass-polyimide resin substrate, alumina substrate, low-temperature fired ceramic substrate, aluminum nitride substrate, aluminum substrate, iron substrate, polyimide film substrate and the like. By using these substrates, there can be manufactured one-side printed boards, both-side through-holed printed boards and multi-layer printed boards such as Cu/polyimide multi-layer printed boards and the like. Moreover, an insulative plate provided with conductor circuit or multi-layer printed board may be used as the substrate.

(2) In a second step, the surface of the adhesive layer formed on the substrate is toughened by dissolving and removing fillers dispersed on the surface with an acid or an oxidizing agent. The removal of the filler can be carried out by immersing the substrate provided with the adhesive layer in a solution of the acid or oxidizing agent, or by spraying the solution of acid or oxidizing agent onto the substrate, or the like. Thus, the surface of the adhesive layer can be roughened.

In order to effectively conduct the removal of the filler, it is very effective that the surface portion of the adhesive layer is previously subjected to polishing with fine abrasive agent or liquid honing to lightly roughen the surface.

As the oxidizing agent for removing the filler, use may be made of chromic acid, chromate, permanganate, ozone and the like. As the acid, use may be made of hydrochloric acid, sulfuric acid, organic acids and the like.

(3) In a third step, the toughened surface of the adhesive layer formed on the substrate is subjected to an electroless plating to form a necessary conductor pattern. As the electroless plating, mention may be made of electroless copper plating, electroless nickel plating, electroless tin plating, electroless gold plating, electroless silver plating and the like.

Before the electroless plating, a plating resist may be formed, if necessary.

After the formation of the electroless plated layer, a different kind of an electroless plating or an electroplating may be carried out, or a solder may be coated.

According to the invention, the conductor pattern can be formed by the conventionally known methods such as the formation of circuit through etching and the like after the electroless plating on the substrate.

The thus obtained printed circuit board according to the invention comprises the substrate, the adhesive layer formed on the substrate by dispersing powder of a cured heat-resistant resin powder soluble in acid or oxidizing agent into a matrix of an uncured photosensitive resin hardly soluble in acid or oxidizing agent, and the conductor circuit formed on the adhesive layer, in which a coloring matter is added to the resin matrix and/or the heat-resistant resin powder, or comprises the substrate, the conductor circuit formed on the substrate, the adhesive layer formed as an interlaminar insulation layer on the conductor circuit by dispersing powder of a cured heat-resistant resin powder soluble in acid or oxidizing agent into a matrix of an uncured photosensitive resin hardly soluble in acid or oxidizing agent, and another conductor circuit formed on the adhesive layer, in which a coloring matter is added to the resin matrix and/or the heat-resistant resin powder.

Moreover, the resin composition according to the invention can be used in various electroless platings in addition to the field of the printed circuit board.

The following examples are given in illustration of the invention and are not intended as limitations thereof.

EXAMPLE 1

A multi-layer printed circuit board is produced according to a build-up process by using a resin composition containing coloring matter according to the invention as a varnish for an adhesive at production steps (1)–(10) as mentioned below.

Figure 1A:
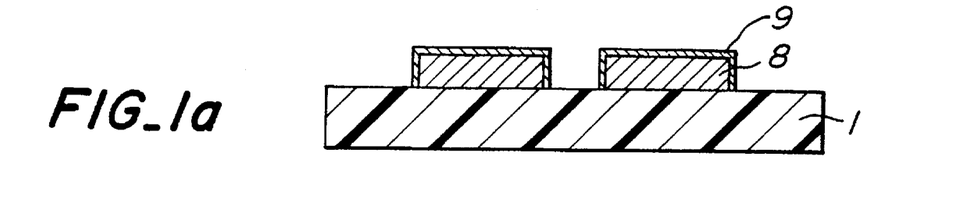
FIGS. 1a to 1e are flow charts illustrating steps of manufacturing an embodiment of the multi-layer printed circuit board according to the invention.

(1) After a copper laminated substrate is etched to form an inner-layer circuit 8, the substrate 1 is acidically degreased and soft-etched, and Cu is replaced with Pd catalyst and activated by reduction, which is subjected to a plating in an electroless plating bath having a composition shown in Table 1, whereby a roughened layer 9 of Ni-P-Cu eutectic crystal having a thickness of 1 μm is obtained. (FIG. 1a).

TABLE 1

| | |
|---|---|
| Copper sulfate: | 10.1 g/l |
| Nickel sulfate: | 1.0 g/l |
| Sodium salt of hypophosphorous acid: | 20.2 g/l |
| Sodium hydroxide: | adequate amount |
| pH: | 9.0 |

(2) 60 parts by weight of 50% acrylated product of cresol novolac-type epoxy resin (made by Yuka Shell Co., Lt. trade name: Epikote 180S) is mixed with 40 parts by weight of bisphenol A-type epoxy resin (made by Yuka Shell Co., Ltd. trade name: E-1001), 15 parts by weight of diallylterephthalate, 4 parts by weight of 2-methyl-1-[4-(methylthio) phenyl] 2-morpholinopropanone-1 (made by Chiba Geigy Co., Ltd. trade name: Irgaquar 907), 10 parts by weight of epoxy resin fine powder (made by Toray Co., Ltd.) having a particle size of 5.5 μm and 25 parts by weight of epoxy resin fine powder (made by Toray Co., Ltd.) having a particle size of 0.5 μm. To 100 parts by weight of the resulting mixture is added 0.75 part by weight of phthalocyanine green, which is further added with a proper amount of butylcellosolve and stirred in a homodisper agitating machine to prepare a varnish for an adhesive.

Figure 1B:
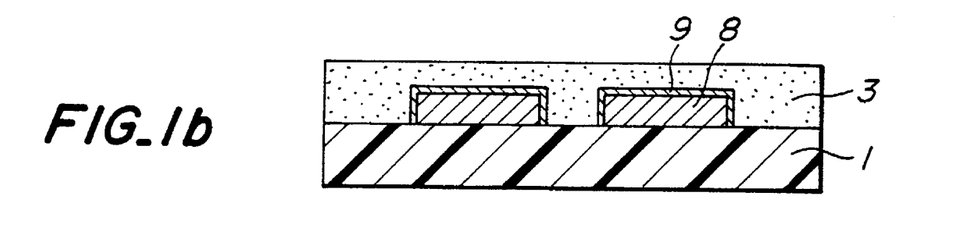

(3) The varnish is applied onto the inner-layer circuit 8 by means of a roll coater and cured under drying at 100° C. for 1 hour to form a photosensitive adhesive layer 3 having a thickness of 50 μm (FIG. 1*b*).

(4) The printed board subjected to the treatment of the step (3) is adhered with a photomask film printed with black circles of 100 μm in diameter and black portions to be punched out, and exposed to a super-high pressure mercury lamp at 500 mj/cm$^2$. It is developed with a chlorocene solution under ultrasonic wave to form openings 4 as a via-hole of 100 μm in diameter on the printed board.

Figure 1C:
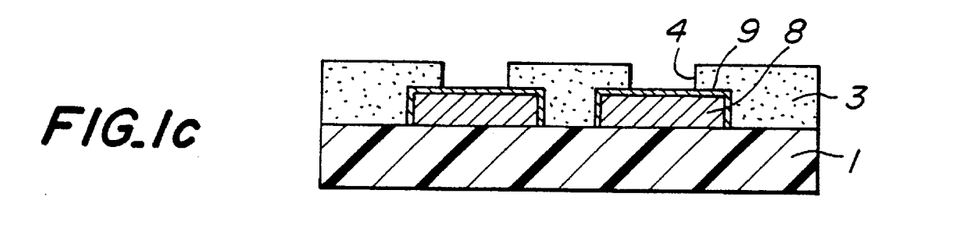

(5) The thus treated printed board is exposed to a super-high pressure mercury lamp at about 300 mj/cm$^2$ and subjected to a heat treatment at 100° C. for 1 hour and further at 150° C. for 3 hours. Thus, there is provided an adhesive layer 3 having the openings 4 with an excellent size accuracy corresponding to the photomask film (FIG. 1*c*).

(6) The printed board is immersed in chromic acid for 10 minutes to roughen the surface of the adhesive layer 3. Further, it is neutralized, washed with water and further with hot water to remove chromic acid from the printed board.

Figure 1D:
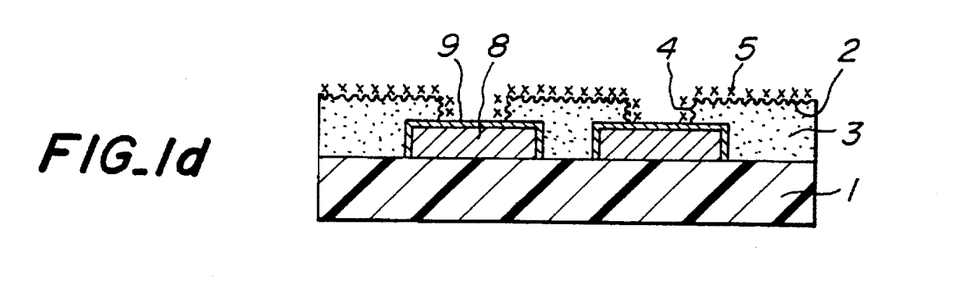

(7) The printed board is immersed in a commercially available Pd-Sn colloid catalyst to adsorb Pd-Sn colloid 5 on the inner wall face of the opening 4 and the roughened surface of the adhesive layer 3, which is heated at 120° C. for 30 minutes (FIG. 1*d*).

(8) A dry film of a photoresist is laminated on the printed board and exposed and developed to form a plated resist 6.

(9) The thus treated printed board is immersed in an aqueous solution of 37% formaldehyde as a reducing agent to activate Pd. In this case, the treating temperature is 40° C. and the treating time is 5 minutes.

Figure 1E:
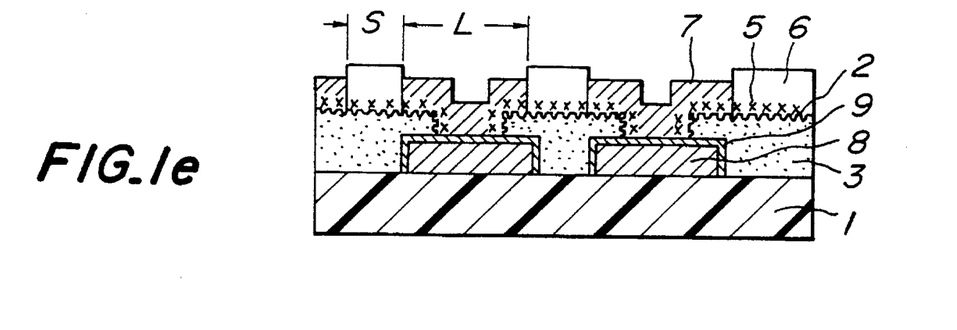

(10) The printed board is immediately immersed in an electroless plating solution having a composition shown in Table 2 and held therein for 15 hours to produce a multi-layer printed circuit board provided with a conductor circuit 7 of a plated film having a thickness of about 35 μm and L/S=75 μm/75 μm (FIG. 1*e*).

TABLE 2

| | |
|---|---|
| $CuSO_4 \cdot 5H_2O$: | 111.8 g/10 liter |
| EDTA.2Na: | 388.2 g/10 liter |
| NaOH: | 111.8 g/10 liter |
| HCHO: | 35.8 g/10 liter |
| Additives: | proper amount |

(11) A liquid composition for photosensitive solder resist is applied onto the above multi-layer printed circuit board in the usual manner and then subjected to exposure and development to form a solder resist 10 containing 1.2 wt % of phthalocyanine green and having a thickness of 30 μm at positions other than a pad portion 11. Moreover, the solder resist 10 is a protection film required for covering the pad with a solder.

EXAMPLE 2

A multi-layer printed circuit board is produced in the same manner as in Example 1 according to a build-up process by using a resin composition containing coloring matter according to the invention as a varnish for an adhesive.

(1) 60 parts by weight of 50% acrylated product of cresol novolac-type epoxy resin (made by Yuka Shell Co., Lt. trade name: Epikote 180S) is mixed with 40 parts by weight of bisphenol A-type epoxy resin (made by Yuka Shell Co., Ltd. trade name: E-1001), 15 parts by weight of diallylterephthalate, 4 parts by weight of 2-methyl-1-[4-(methylthio) phenyl] 2-morpholinopropanone-1 (made by Chiba Geigy Co., Ltd. trade name: Irgaquar 907), 10 parts by weight of epoxy resin fine powder (made by Toray Co., Ltd.) having a particle size of 5.5 μm and 25 parts by weight of epoxy resin fine powder (made by Toray Co., Ltd.) having a particle size of 0.5 μm. To 100 parts by weight of the resulting mixture is added 0.50 part by weight of phthalocyanine green, which is further added with a proper amount of butylcellosolve and stirred in a homodisper agitating machine to prepare a varnish for an adhesive.

(2) The same procedure as in the steps (3)–(10) of Example 1 is repeated 2 or more times by using the varnish of the step (1) to produce a multi-layer printed circuit board having a three layer structure.

Figure 2A:
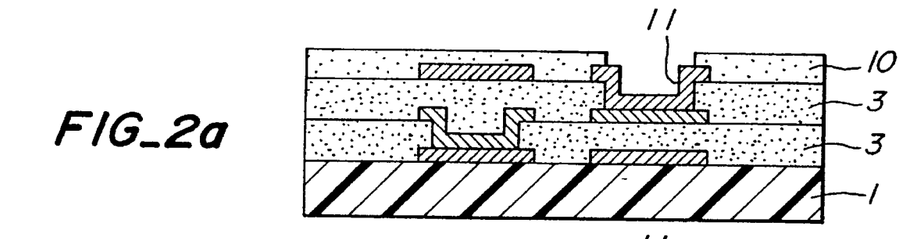
FIGS. 2a to 2d are diagrammatically sectional views illustrating the three-layer printed circuit boards of Example 2 and Comparative Examples 1 to 3, respectively.

(3) A liquid composition for photosensitive solder resist is applied onto the above multi-layer printed circuit board in the usual manner and then subjected to exposure and development to form a solder resist 10 containing 0.4 wt % of phthalocyanine green and having a thickness of 15 μm at positions other than a pad portion 11 (FIG. 2*a*).

EXAMPLE 3

The same procedure as in Example 1 is repeated except that 0.75 part by weight of phthalocyanine blue and 30 parts by weight of an amine curing agent are added to 100 parts by weight of the epoxy resin prepolymer, cured at 150° C. and pulverized to form a heat-resistant resin powder.

EXAMPLE 4

A thermoplastic resin is injection-molded into a handle for a drawer, a part of which handle is coated with the same resin composition containing the coloring matter as in Example 1. Then, it is cured, toughened with chromic acid and subjected to an electroless nickel plating in the usual manner to obtain a handle colored in green and having a metal gloss.

EXAMPLE 5

(1) 60 parts by weight of 50% acrylated product of cresol novolac-type epoxy resin (made by Yuka Shell Co., Lt. trade name: Epikote 180S) is mixed with 40 parts by weight of bisphenol A-type epoxy resin (made by Yuka Shell Co., Ltd. trade name: E-1001), 15 parts by weight of diallylterephthalate, 4 parts by weight of 2-methyl-1-[4-(methylthio) phenyl] 2-morpholinopropanone-1 (made by Chiba Geigy Co., Ltd. trade name: Irgaquar 907), 10 parts by weight of epoxy resin fine powder (made by Toray Co., Ltd.) having a particle size of 5.5 μm and 25 parts by weight of epoxy resin fine powder (made by Toray Co., Ltd.) having a particle size of 0.5 μm. To 100 parts by weight of the resulting mixture is added 0.75 part by weight of NK 1160 (made by Nippon Kanko Shikiso Kenkyusho, blue), which is further added with a proper amount of butylcellosolve and stirred in a homodisper agitating machine to prepare a varnish for an adhesive.

(2) The above varnish is applied to the substrate obtained in the step (1) of Example 1 and subjected to a heat treatment at 80° C. for 1 hour and further at 150° C. for 3 hours.

(3) It is immersed in chromic acid for 10 minutes to roughen the surface of the adhesive layer, which is neutralized and washed with water and further with hot water to remove chromic acid from the printed board.

(4) The printed board is pierced at given position by means of a drill.

(5) The same procedure as in the steps (7)–(11) of Example 1 is repeated to produce a multi-layer printer circuit board.

EXAMPLE 6

The same procedure as in Example 5 is repeated except that NK 3682 (made by Nippon Kanko Shikiso Kenkyusho, green) is used instead of NK 1160 as a coloring matter.

EXAMPLE 7

A single-layer printed circuit board is produced by using the same resin composition containing a coloring matter as in the step (2) of Example 1 as a varnish for adhesive.

(1) The varnish for adhesive prepared in the step (2) of Example 1 is applied onto a glass-epoxy resin substrate by means of a roll coater and dried and cured at 100° C. for 1 hour to form an adhesive layer having a thickness of 50 μm.

(2) The same procedure as in the steps (6)–(11) of Example 1 is repeated to produce a single-layer printed circuit board.

COMPARATIVE EXAMPLE 1

Figure 2B:
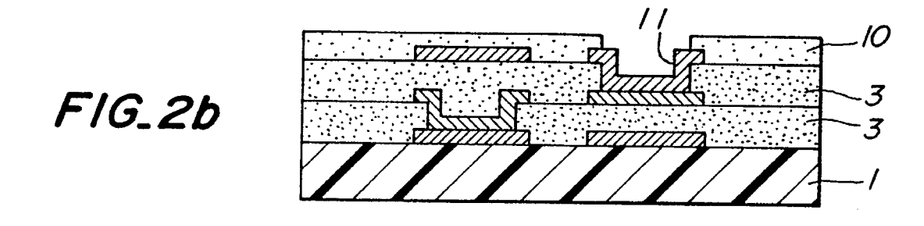

The same procedure as in Example 1 is repeated except that the varnish containing no coloring matter is used, whereby a multi-layer printed circuit board having a three-layer structure is produced. Then, a liquid composition for a photosensitive solder resist is applied to the multi-layer printed circuit board in the usual manner and subjected to exposure and development to form a solder resist 10 containing 2.0 wt % of phthalocyanine green and having a thickness of 30 μm at positions other than a pad portion 11 (FIG. 2*b*).

COMPARATIVE EXAMPLE 2

Figure 2C:
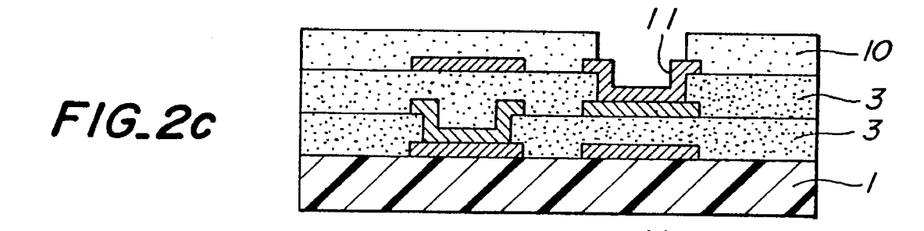

The same procedure as in Example 1 is repeated except that the varnish containing no coloring matter is used, whereby a multi-layer printed circuit board having a three-layer structure is produced. Then, a liquid composition for a photosensitive solder resist is applied to the multi-layer printed circuit board in the usual manner and subjected to exposure and development to form a solder resist 10 containing 1.0 wt % of phthalocyanine green and having a thickness of 70 μm at positions other than a pad portion 11 (FIG. 2*c*).

COMPARATIVE EXAMPLE 3

Figure 2D:
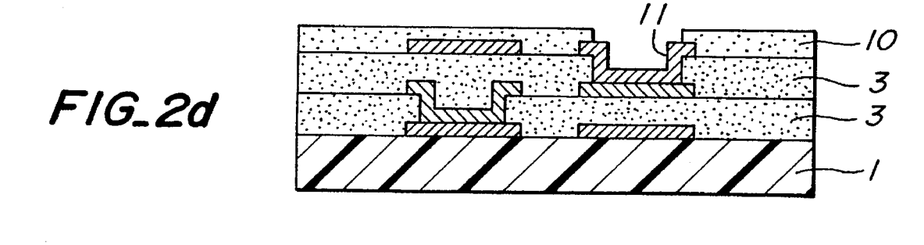

The same procedure as in Example 1 is repeated except that the varnish containing no coloring matter is used, whereby a multi-layer printed circuit board having a three-layer structure is produced. Then, a liquid composition for a photosensitive solder resist is applied to the multi-layer printed circuit board in the usual manner and subjected to exposure and development to form a solder resist 10 containing 1.0 wt % of phthalocyanine green and having a thickness of 30 μm at positions other than a pad portion 11 (FIG. 2*d*).

As regards the printed circuit boards obtained in the above examples and Comparative Examples, the color tone of the substrate, the resolution of the solder resist and the like are measured to obtain results as shown in Table 3.

TABLE 3

|  | (a) Examples 1–7 | (b) Comparative Example 1 | (c) Comparative Example 2 | (d) Comparative Example 3 |
| --- | --- | --- | --- | --- |
| Color tone of substrate | good | dark | good | spotted |
| SR resolution | 100 μm | 200 μm | 200 μm | 100 μm |
| SR thickness | 30 μm | 30 μm | 70 μm | 30 μm |
| Exposure time | 15 sec | 45 sec | 45 sec | 15 sec |
| Amount of resin used | 100 g/cm$^2$ | 100 g/cm$^2$ | 220 g/cm$^2$ | 100 g/cm |

SR: solder resist

In Comparative Example 1, the amount of phthalocyanine green in the solder resist is too large, so that the color tone of the substrate becomes deep and the resolution of the solder resist lowers. Furthermore, phthalocyanine green lowers the sensitivity of the photosensitive resin to light, so that the exposure time should be prolonged.

In Comparative Example 2, the thickness of the solder resist is too thick, so that the resolution of the resist and the sensitivity of the photosensitive resin to light lowers. Furthermore, the amount of the resin used becomes large, which brings about the increase of the cost.

In Comparative Example 3, the spotted discoloration of the resin is transparently observed and the color tone of the substrate is poor.

Thus, when using the conventional solder resist process, all of the appearance and color tone of the substrate, the resolution and thickness of the solder resist, the exposure time and cost can not be satisfied. In this connection, the invention satisfies all of the above conditions and can advantageously provide printed circuit boards having excellent appearance and color tone without damaging the reliability and the like.

Then, the effect of controlling the deterioration of the photosensitive resin through the addition of the coloring matter will be described with respect to the printed circuit boards obtained in Examples and Comparative Examples.

At first, the printed circuit boards of Example 1 and Comparative Example 3 are stored in an atmosphere having a humidity of 85%, an oxygen concentration of 100% and a temperature of 85° C., which is exposed to an ultraviolet ray at 1 J/cm$^2$.min to conduct a deterioration test.

As a result, when the lowering of peel strength is considered to be the deterioration of the resin constituting the varnish for the adhesive, the time of reducing the peel strength to ½ is 1000 hours in Example 1 and 200 hours in Comparative Example 3.

That is, it is confirmed that the coloring matter such as phthalocyanine can control the deterioration of the photosensitive resin.

This effect is true in the cyanine color used in Examples 5 and 6.

Although the above examples are described with respect to the the printed circuit board provided at its surface with a pad, the resin composition according to the invention can be applied to a printed circuit board not provided at its surface with a pad, i.e., a multilayer printed circuit board not requiring the formation of solder resist at its surface.

As mentioned above, the resin composition according to the invention can advantageously provide printed circuit boards having excellent appearance and color tone and at the same time can attain the improvement of resolution in the solder resist, decreases of film thickness, exposure time and cost, which have never been attained in the conventional coloring method such as solder resist method.

Furthermore, according to the invention, the resin is hardly deteriorated as compared with the conventional adhesive and can prolong the service life of the printed circuit board, so that the resin composition according to the invention can be used under severer conditions.

What is claimed is:

1. A multilayer printed circuit board comprising:
   a substrate;
   a first conductor circuit formed on the substrate;
   an adhesive layer formed on the conductor circuit by dispersing 5–350 parts by weight of particles of a cured heat-resistant resin soluble in an acid or an oxidizing agent into 100 parts by weight of a matrix of an uncured photosensitive resin hardly soluble in the acid or oxidizing agent;
   a second conductor circuit formed on the adhesive layer and electrically connected to the first conductor circuit through a via-hole;
   wherein the particles of the cured heat-resistant resin include 0.10–1.50% by weight of coloring matter selected from the group consisting of phthalocyanine, phthalocyanine derivatives and cyanine color.

2. The multilayer printed circuit board according to claim 1, wherein said phthalocyanine and said phthalocyanine derivatives comprise compounds of general formula (I) and said cyanine color comprise compounds of general formula (II) and (III):

Formula (I)

wherein, M is an ion of a metal selected from sodium, potassium, copper, iron, cobalt or nickel, and X is a hydrogen atom, a halogen atom selected from the group consisting of chlorine, bromine, fluorine and iodine, or an alkyl group;

Formula (II)

wherein Y and Y' are O, S, Se, —NH or —CH=CH—, R and R' are an alkyl group or a carboxyalkyl group, X is a halogen atom and n is 0–3;

Formula (III)

wherein X is S or C(CH$_3$)$_2$, R is a halogen atom, an alkyl group or a hydrogen atom, n is 0–5, m is 0–4 and k is 0–6.

3. The multilayer printed circuit board according to claim 2, wherein said coloring matter comprises a compound of general formula (I) wherein M is copper and X is a hydrogen atom.

4. The multilayer printed circuit board according to claim 2, wherein said coloring matter comprises a compound of general formula (I) wherein M is copper and X is a chlorine atom.

5. The multilayer printed circuit board according to claim 2, wherein said coloring matter comprises a compound of general formula (II) wherein Y and Y' are S, R' is —CH$_2$CH$_2$COOH, and n is 2.

6. The multilayer printed circuit board according to claim 2, wherein said coloring matter comprises a compound of general formula (III) wherein X is C(CH$_3$)$_2$, R is a hydrogen atom, n is 3, m is 2, and k is 4.

7. The multilayer printed circuit board according to claim 2, wherein said heat-resistant resin particles are selected from the group consisting of (1) heat resistant resin powder having an average particle size of not more than 10 μm, (2) aggregated particles having an average particle size of 2–10 μm formed from heat-resistant resin powder having an average particle size of not more than 2 μm, (3) a mixture of heat-resistant resin powder having an average particle size of 2–10 μm and heat-resistant resin powder having an average particle size of not more than 2 μm, and (4) false-particles formed by adhering at least one of heat-resistant resin powder having an average particle size of not more than 2 μm and inorganic powder having an average particle size of not more than 2 μm to surfaces of heat-resistant resin powder having an average particle size of 2–10 μm.

8. The multilayer printed circuit board according to claim 1, wherein said particles of a cured heat-resistant resin are present in a range of 20–200 parts by weight per 100 parts by weight of solid content in said matrix.

9. The multilayer printed circuit board according to claim 1, wherein said adhesive layer has a thickness of about 20–100 μm.

\* \* \* \* \*

UNITED STATES PATENT AND TRADEMARK OFFICE
CERTIFICATE OF CORRECTION

PATENT NO. : 5,589,250
DATED : December 31, 1996
INVENTOR(S) : M. ASAI et al.

It is certified that error appears in the above-indentified patent and that said Letters Patent is hereby corrected as shown below:

At column 14, line 18 (claim 2, line 6), after "wherein" delete ---,---.

Signed and Sealed this

Sixth Day of May, 1997

BRUCE LEHMAN

*Attest:*

*Attesting Officer*   *Commissioner of Patents and Trademarks*